United States Patent
Li et al.

(10) Patent No.: US 8,427,819 B1
(45) Date of Patent: Apr. 23, 2013

(54) SUBSTRATE INTERCONNECT ROUTING

(75) Inventors: Chris T. Li, Fremont, CA (US); Christopher Paul Lander, Morgan Hill, CA (US); Ximeng Yang, San Francisco, CA (US); Amish Rajesh Babu, Sunnyvale, CA (US); Shyeu-Yang Wang, Sunnyvale, CA (US)

(73) Assignee: Amazon Technologies, Inc., Reno, NV (US)

( * ) Notice: Subject to any disclaimer, the term of this patent is extended or adjusted under 35 U.S.C. 154(b) by 288 days.

(21) Appl. No.: 12/964,557

(22) Filed: Dec. 9, 2010

(51) Int. Cl.
*G06F 1/16* (2006.01)

(52) U.S. Cl.
USPC ... 361/679.21; 349/106; 345/212; 248/187.1; 174/256

(58) Field of Classification Search .................... 349/54, 349/58, 187, 106, 41; 345/92, 174, 173, 345/184, 212, 690; 361/704, 708, 679.43, 361/679.41, 679.01, 679.47, 679.55, 679.08, 679.17, 679.58, 679.03, 679.09, 679.52, 679.04, 679.21, 679.33; 248/560, 544, 638, 179.1, 248/187.1, 570, 288.11, 543, 274.1; 174/16.3, 174/138 G, 58, 59, 50, 254, 262, 256; 324/240; 360/132, 92.1

See application file for complete search history.

(56) References Cited

U.S. PATENT DOCUMENTS

| 7,948,600 | B2 * | 5/2011 | Okamoto et al. ............. 349/187 |
| 2004/0114062 | A1 * | 6/2004 | Nishio et al. .................... 349/58 |
| 2006/0001792 | A1 * | 1/2006 | Choi ............................... 349/54 |
| 2009/0179846 | A1 * | 7/2009 | Miyata et al. ................... 345/92 |

* cited by examiner

*Primary Examiner* — Hung Duong

(74) *Attorney, Agent, or Firm* — Lee & Hayes, PLLC

(57) ABSTRACT

One or more data signal interconnects arranged on a substrate of a dense array reduce overall size of a device incorporating the dense array, such as a touch sensor or display. The data signal interconnects on the substrate carry signals from printed circuits coupled to the array to a controller via interconnect tabs.

28 Claims, 9 Drawing Sheets

802 — FORM A SUBSTRATE SIGNAL INTERCONNECT HAVING A FIRST END PROXIMATE TO FIRST SIDE OF A SUBSTRATE AND A SECOND END PROXIMATE TO A SECOND SIDE OF THE SUBSTRATE

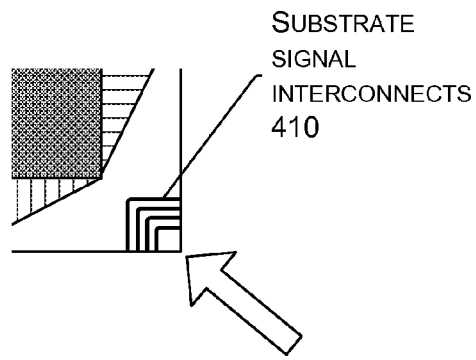

SUBSTRATE SIGNAL INTERCONNECTS 410

804 — CONNECT A FIRST SIDE OF A FIRST INTERCONNECT TAB TO THE FIRST END OF THE SUBSTRATE SIGNAL INTERCONNECT AND CONNECT A FIRST SIDE OF A SECOND INTERCONNECT TAB TO THE SECOND END OF THE SUBSTRATE SIGNAL INTERCONNECT

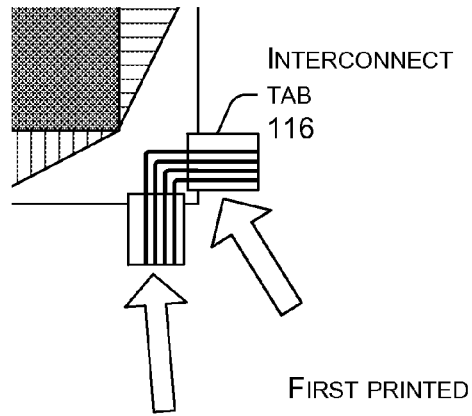

INTERCONNECT TAB 116

806 — CONNECT A FIRST CIRCUIT BOARD TO A SECOND SIDE OF THE FIRST INTERCONNECT TAB AND A SECOND CIRCUIT BOARD TO A SECOND SIDE OF THE SECOND INTERCONNECT TAB, THEREBY COUPLING A SIGNAL LINE OF THE SECOND PRINTED CIRCUIT WITH A SIGNAL LINE OF THE FIRST PRINTED CIRCUIT

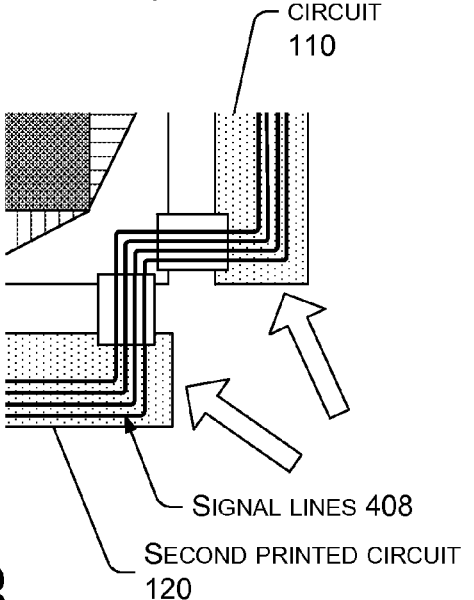

FIRST PRINTED CIRCUIT 110

SIGNAL LINES 408
SECOND PRINTED CIRCUIT 120

FIG. 8

SUBSTRATE INTERCONNECT ROUTING

BACKGROUND

Users increasingly demand devices with additional capabilities and physical configurations such as high-resolution displays and touch-sensitive input devices. Users also demand these capabilities and configurations in ever smaller form factors (that is, an overall size of the device), such as in portable electronics. Traditionally, incorporating such capabilities and physical configurations into an electronic device has complicated the manufacture and assembly of the device, as well as undesirably increasing the overall size of the device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

FIG. 8 is an illustrative process of coupling two interconnect tabs to substrate signal interconnects and then coupling a printed circuit to each of the interconnect tabs.

DETAILED DESCRIPTION

Overview

Electronic devices such as cellular phones, portable media players, tablet computers, netbooks, laptops, electronic book ("eBook") readers, and so forth, increasingly incorporate addressable arrays such as displays, touch sensors, and so forth. As the density of the addressable arrays increases, routing connections for the additional drive signals, readout lines, and so forth have become more difficult within the confines of ever smaller devices. Traditional use of ribbon cables, flexible printed circuits, and so forth, to direct signals from the addressable array to a controller introduces several constraints. Minimum bend radii must be maintained. Transitions between levels within the three-dimensional architecture of the assembled device require volume. Placement of connectors onto cables and circuit boards requires additional volume. In short, traditional interconnects use significant portions of internal volume and may call for convoluted routing of cables.

This disclosure describes, in part, the use of substrate signal interconnects to convey signals between printed circuits, controllers, and so forth. Addressable array devices such as displays, touch sensors, and so forth may have areas on their substrates that are otherwise unused. One or more substrate signal interconnects are formed on at least a portion of the unused areas of the substrate. Signal lines on printed circuits adjacent to the substrate are configured to be coupled to the substrate signal interconnects via interconnect tabs. By using the substrate signal interconnects, signal lines may be consolidated together into a reduced space. Additionally, the signal lines may be aggregated into a reduced number of cables leading to a controller, minimizing or altogether eliminating line routing issues.

Substrate Interconnect Routing

Figure 1:
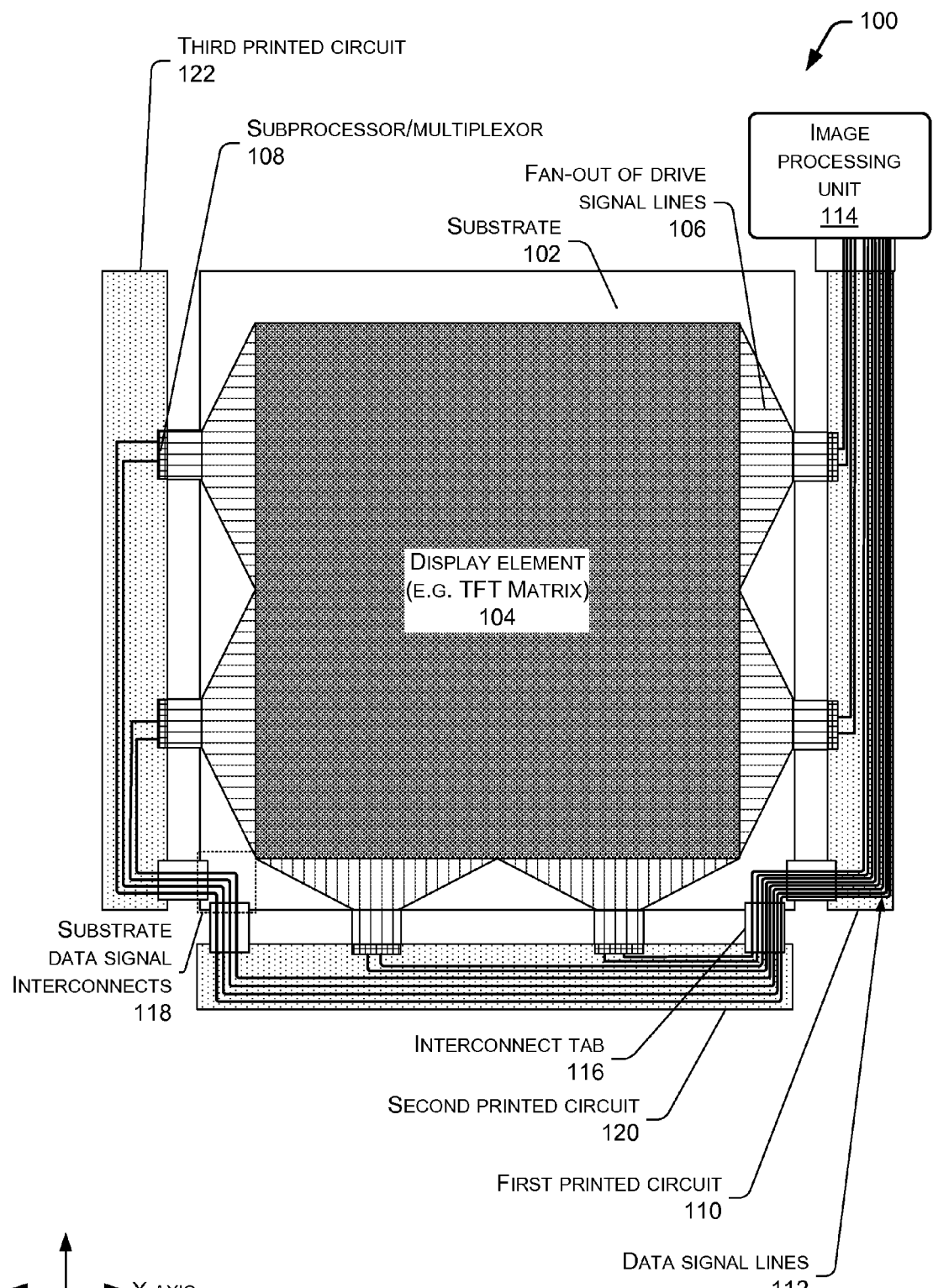
FIG. 1 is an illustrative arrangement of components within an electronic device utilizing substrate interconnects in a daisy-chain configuration.

FIG. 1 is an illustrative arrangement 100 of components within an electronic device utilizing substrate interconnects in a daisy-chain configuration. A substrate 102 provides a foundation upon which another component, such as a display element 104, is formed or affixed. The substrate 102 may comprise metal, glass, plastic, or a composite material. The display element 104 may comprise a thin-film transistor matrix, suitable for addressing particular pixels within the display. As display resolutions increase, thus decreasing pixel size, there is a corresponding increase in the number of signal lines per linear measurement within the display element 104. A grouping of signal lines may be aggregated via a fan-out 106 for coupling to a subprocessor or multiplexor ("subprocessor") 108. The subprocessor 108 may be configured to accept incoming data signals and emit drive signals along appropriate drive signal lines in the fan-out 106 that are used to control pixels.

The subprocessor 108 may be disposed upon a printed circuit. This printed circuit may be a flexible printed circuit ("FPC"), rigid printed circuit, semi-rigid printed circuit, and so forth. As used in this disclosure, the printed circuit includes arrangements of pathways suitable for transferring a signal from one location to another. The printed circuit may include other components such as the subprocessor 108, resistors, capacitors, inductors, and so forth. The printed circuit may be formed from operations including bonding, lamination, deposition, etching, imprint lithography, and so forth.

As shown in this illustration, a first printed circuit 110 is disposed generally parallel to a right side of the substrate 102. The first printed circuit 110 is shown with two subprocessors 108, each coupled to a fan-out of drive signal lines 106. Each of the subprocessors 108 is coupled with a pair of data signal lines 112 to an image processing unit 114. The image processing unit 114 is configured to accept input and generate images on the display. The two subprocessors 108 and two data signal lines 112 are illustrative and are not to be construed as limitations. In other implementations, subprocessors 108 may be omitted, intermediate processors may be added, drive signal lines may be coupled directly to the image processing unit 114, and so forth. Similarly, one or more data signal lines 112 may couple the subprocessor 108 to the image processing unit 114.

Additional printed circuits may be disposed around at least a portion of a perimeter of the substrate 102. To provide a pathway for signals between the data signal lines 112 on the first printed circuit 110 and the data signal lines 112 on other printed circuits, an interconnect tab 116 couples the printed circuit to substrate data signal interconnects 118 disposed on the substrate 102. By utilizing the interconnect tabs 116 and the substrate data signal interconnects 118, overall trace routing is simplified.

The interconnect tab 116 may itself comprise a printed circuit, and thus may be a flexible printed circuit, rigid printed circuit, and so forth. The interconnect tab 116 may be joined to the printed circuit and the substrate 102 via adhesion, lamination, soldering, welding, or a combination thereof. In some implementations each of the two ends of the interconnect tab 116 may be joined using different methods. For example, a first end of the interconnect tab 116 may be joined to the printed circuit via soldering, while a second end of the interconnect tab 116 may be joined to the substrate via adhesion. The interconnect tab 116 incorporates one or more pathways suitable for transferring signals. For example, where the signals are electrical, the interconnect tab 116 may incorporate conductors such as metals, conductive polymers, and so forth. Where the signals are optical, the interconnect may comprise an optical waveguide.

The data signal interconnects 118 may be on the substrate 102, or may be integrated into the substrate 102. The data signal interconnects 118 may be formed from operations including bonding, lamination, deposition, etching, imprint lithography, and so forth. These operations may occur during the formation of the display element 104, or may occur separately. The substrate data signal interconnects 118 may be disposed on a same side of the substrate 102, such as the display element 104, or in some implementations may be disposed on an opposite side. The interconnects may be configured to transport electromagnetic signals including electric, magnetic, optical, radio frequency, and so forth.

The printed circuits are also coupled to the display element 104 via the fan-outs 106 and subprocessors 108. In this illustration, a second printed circuit 120 is shown disposed generally parallel to a bottom of the perimeter of the display element 104 and a third printed circuit 122 is shown arranged generally parallel to the left edge of the perimeter of the substrate 102.

The data signal lines 112 from the second printed circuit 120 and the third printed circuit 122 are connected with the image processing unit 114 via the arrangement of the substrate data signal interconnects 118 and the interconnect tabs 116. Thus, as shown here, data signal lines 112 from the third printed circuit 122 extend to a position adjacent to corresponding substrate data signal interconnects 118 located in a lower left corner of the substrate 102. A first interconnect tab 118 couples the data signal lines 112 on the third printed circuit 122 to the substrate data signal interconnects 118. A second interconnect tab 118 in turn couples the substrate data signal interconnects 118 to the data signal lines 112 of the second printed circuit 120. These data signal lines 112 traverse the second printed circuit 120, coupling via another set of interconnect tabs 116 and substrate data signal interconnects 118 to corresponding data signal lines 112 on the first printed circuit 110. These data signal lines 112 in turn traverse the first printed circuit 110 to ultimately connect to the image processing unit 114. As a result, a daisy chain is formed to convey the signals from the subprocessors 108 to the image processing unit 114.

As a result of the routing of signals via the substrate data signal interconnects 118, a discrete cable or connection extending from each of the printed circuits coupled to the display element 104 is avoided. This reduces the complexity and difficulty in internally routing these cables and also reduces the size of the corresponding connectors. For example, rather than three discrete connectors each of which each have volumetric overhead and structural elements, a single connector which occupies less area and volume may be used to accept all of the data signal lines 112. Furthermore, in some implementations, the placement of the printed circuits in approximately the same plane as the substrate 102 may reduce overall height of the device.

Figure 2:
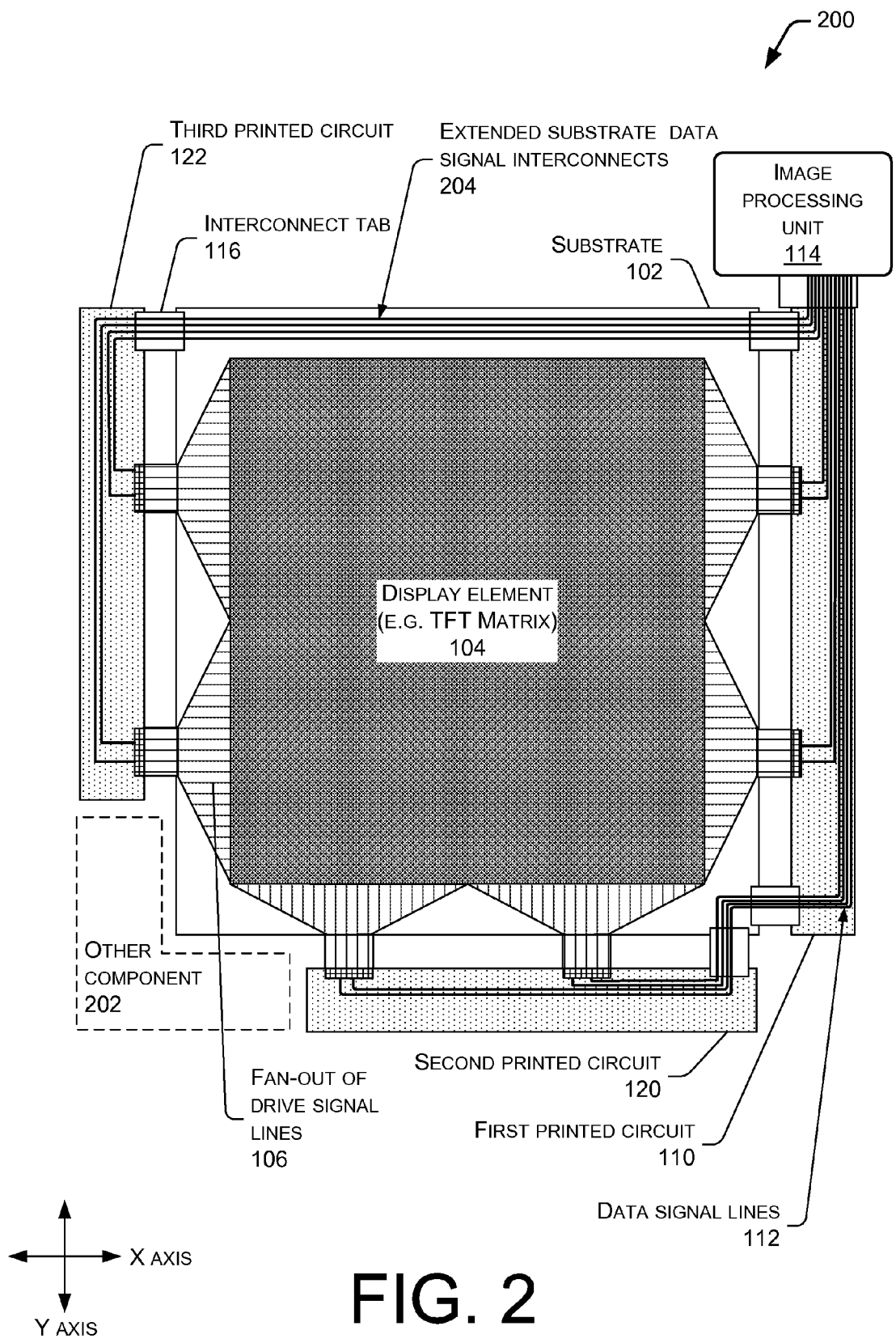
FIG. 2 is an illustrative arrangement of components within an electronic device utilizing substrate interconnects in a direct-route configuration.

FIG. 2 is an illustrative arrangement 200 of components within an electronic device utilizing substrate interconnects in a direct-route configuration. Given the volumetric constraints and engineering considerations that affect placement of internal components within electronic devices, it may be desirable to use different routing of data signal lines.

In this illustration, another component 202 extends into an area proximate to the lower-left corner of the substrate 102. Presence of this component precludes the use of the substrate routing in that corner. The subprocessors 108 of the second printed circuit 120 remain connected to the image processing unit 114 via the substrate data signal interconnects 118 and the interconnect tabs 116 as described above. However, as shown here, the third printed circuit 122 is coupled via the interconnect tabs 116 to extended substrate data signal interconnects 204. These extended substrate data signal interconnects 204 are disposed proximate to a top of the third printed circuit 122 along the left edge of the substrate 102. The extended substrate data signal interconnects 204 in turn extend to a location proximate to the first printed circuit board 110, and are coupled to data signal lines 112 disposed thereon via an interconnect tab 116.

Figure 3:
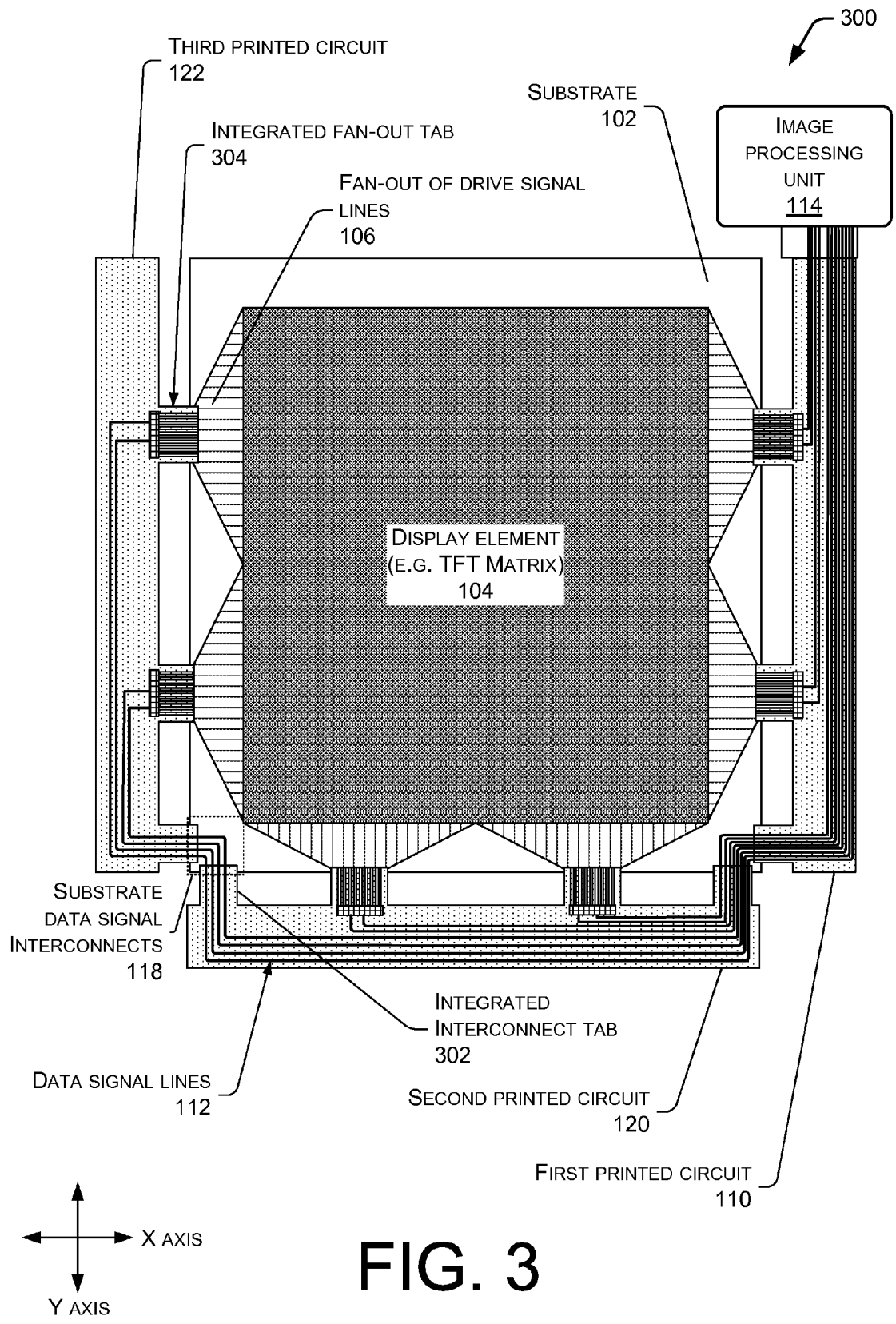
FIG. 3 is an illustrative arrangement of components within an electronic device utilizing substrate interconnects, wherein the printed circuits incorporate integrated interconnect tabs.

FIG. 3 is an illustrative arrangement 300 of components within an electronic device utilizing substrate interconnects wherein the printed circuits incorporate integrated interconnect tabs. The printed circuits may be modified to incorporate one or more integrated interconnect tabs 302. The integrated interconnect tabs 302 may comprise an extension of the printed circuit and corresponding data signal lines 112.

The integrated interconnect tabs 302 improve logistics and assembly of the electronic device by minimizing overall discrete parts count and assembly operations. In some implementations, the printed circuits may also incorporate integrated fan-out tabs 304. The integrated fan-out tabs 304 are configured to couple the fan-outs 106 to the subprocessor 108 on the printed circuit. Placement of integrated interconnect tabs 302 and the fan-out tabs 304 on the same printed circuit allows for easier contemporaneous joining by providing a single piece (the printed circuit) with all free ends for joining.

Figure 4:
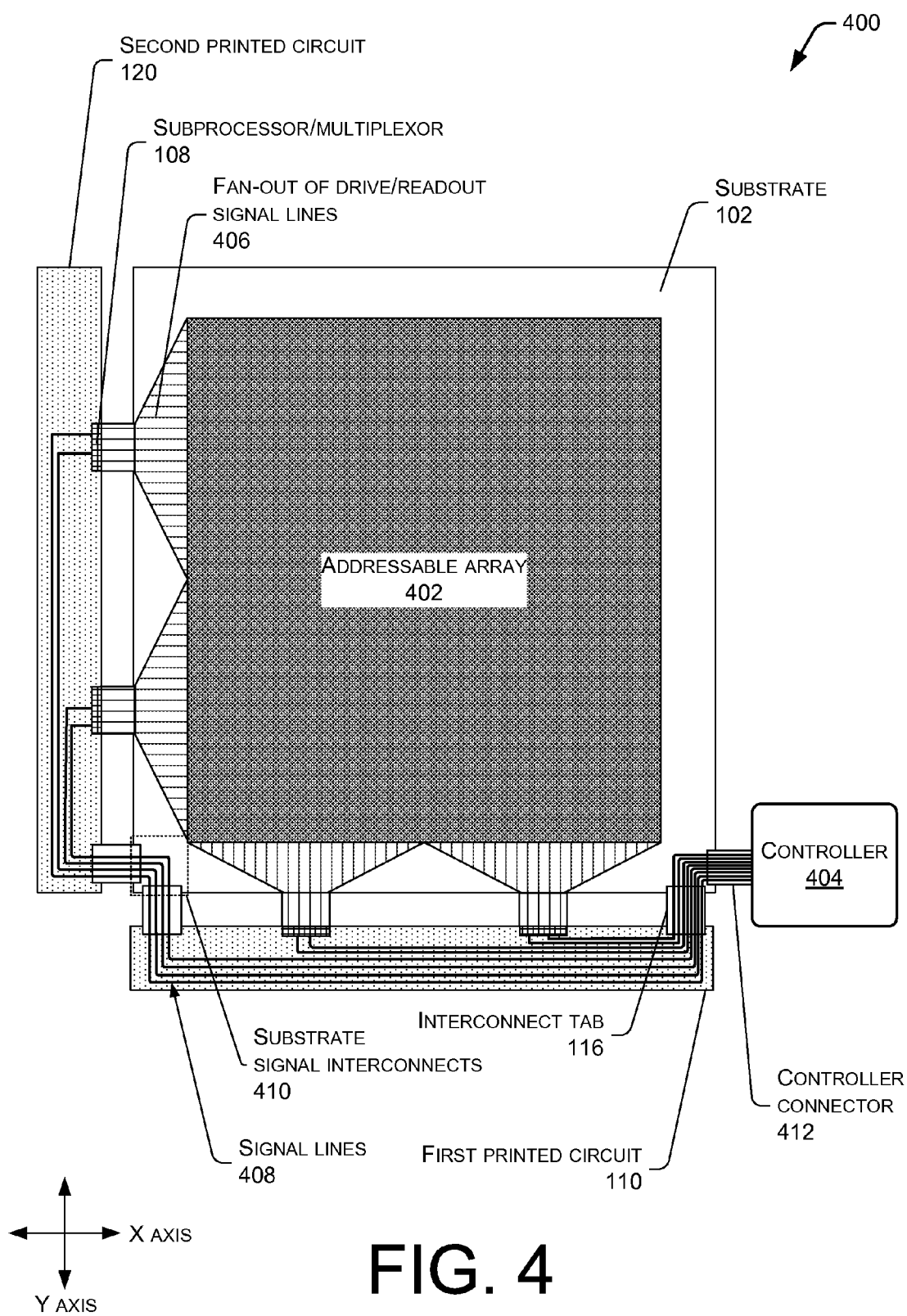
FIG. 4 is an illustrative arrangement of components within an electronic device utilizing substrate interconnects to couple an addressable array to a controller.

FIG. 4 is an illustrative arrangement 400 of components within an electronic device utilizing substrate interconnects to couple an addressable array to a controller. As described above, substrate interconnects may be used to provide couplings between elements of an addressable array 402 and a controller 404. Addressable arrays include displays as described above, but may also include touch sensors, haptic output arrays, image sensors, and so forth.

Individual lines within a given portion of the addressable array 402 are consolidated into a fan-out of drive/readout signal lines 406. These in turn may, but need not, be coupled to the subprocessor 108. In some implementations fan-outs of drive/readout signal lines 406 may be disposed on opposite corresponding sides. For example, in the case of a high resolution addressable array a second set of the fan-out of drive/readout signal lines 406 may be disposed on the right and top of the addressable array 402 shown here.

Signals between the addressable array 402 and the controller 404 may traverse signal lines 408 on the printed circuits. These signal lines 408 are in turn coupled to substrate signal interconnects 410 via the interconnect tabs 116.

As shown in this illustration, the substrate interconnects 410 may couple the first printed circuit 110 to the controller 404. An interconnect tab 116 or a controller connector 412, such as a flexible printed circuit, may be coupled to the substrate interconnects 410 and then to the controller 404.

Figure 5:
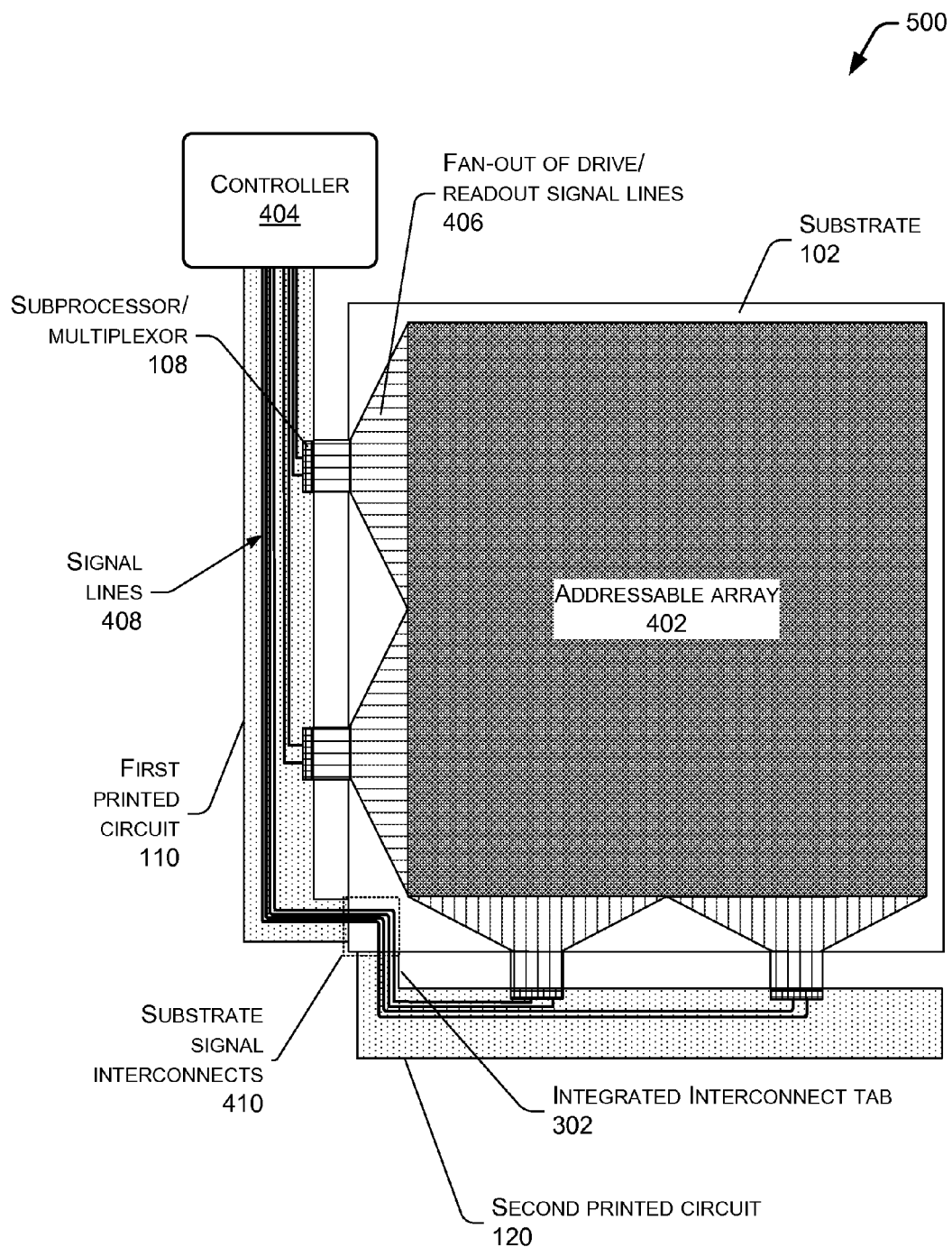
FIG. 5 is another illustrative arrangement of components within an electronic device utilizing integrated interconnect tabs and substrate interconnects to couple an addressable array to a controller.

FIG. 5 is another illustrative arrangement 500 of components within an electronic device utilizing integrated interconnect tabs and substrate interconnects to couple an addressable array to a controller. As above, individual lines within a given portion of the addressable array 402 are consolidated into a fan-out of drive/readout signal lines 406. These in turn may, but need not, be coupled to the subprocessor 108. Signals between the addressable array 402 and the controller 404 may traverse signal lines 408 on the printed circuits which are in turn coupled to substrate signal interconnects 410 via the integrated interconnect tab 302, or in other implementations by the interconnect tab 116.

As shown here, the first printed circuit 110 is coupled to the controller 404. The integrated interconnect tabs 302 on the first printed circuit 110 and on the second printed circuit 120 couple the signals lines 408 on the second printed circuit 120 to the controller 404. This configuration is advantageous in that the individual printed circuits are kept relatively small compared to a larger "L" shaped printed circuit extending along two sides of the substrate 102. Furthermore, routing the signal lines 408 via the printed circuits and the substrate signal interconnects 410 minimizes or eliminated extension of the substrate 102 otherwise used to provide for those signal lines 408.

Figure 6:
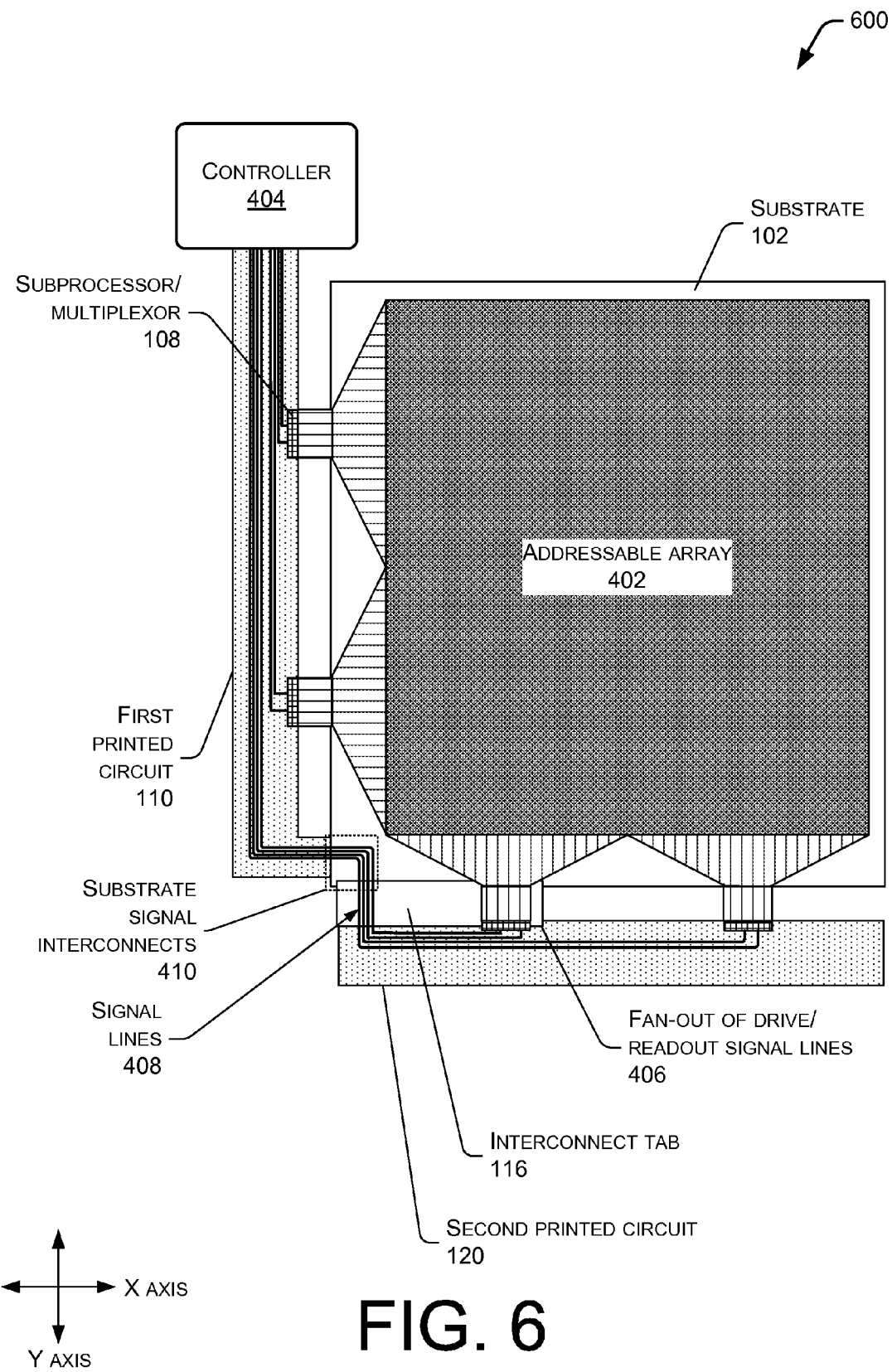
FIG. 6 is another illustrative arrangement of components within an electronic device utilizing interconnect tabs carrying data signals and drive signals and substrate interconnects to couple an addressable array to a controller.

FIG. 6 is another illustrative arrangement 600 of components within an electronic device. In this illustration, the interconnect tab 116 carries readout/drive signal lines 406 as well as signal lines 408. As above, these signal lines 408 couple to the substrate signal interconnects 410 for coupling the addressable array to the controller 404.

Process of Establishing Substrate Interconnects

Figure 7:
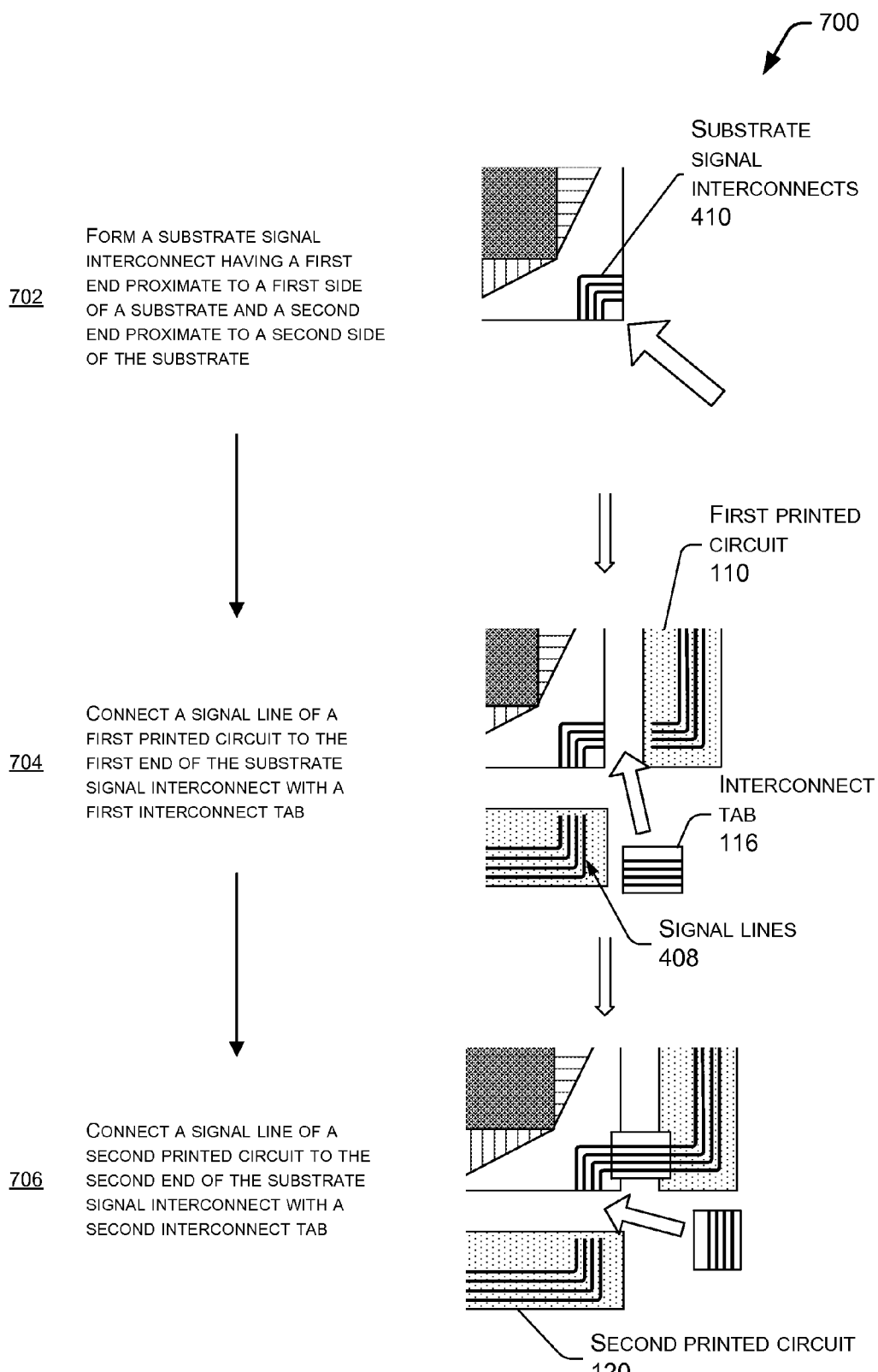
FIG. 7 is an illustrative process of coupling two printed circuits via substrate signal interconnects and interconnect tabs.

FIG. 7 is an illustrative process 700 of coupling two printed circuits via substrate signal interconnects and interconnect tabs. At 702, one or more substrate signal interconnects 410 are formed on the substrate. The substrate signal interconnects 410 or substrate data signal interconnects 118 may be formed from operations including bonding, lamination, deposition, etching, imprint lithography, and so forth.

Each of the substrate signal interconnects 410 have a first end proximate to a first side of the substrate 102 and a second end proximate to a second side of the substrate 102. For example, as shown here in an enlarged corner of the substrate 102, the substrate signal interconnects 410 extend from the lowermost right edge of the substrate 102 to the rightmost bottom edge of the substrate 102. While the substrate signal interconnects 410 are shown describing a generally right angle turn, in other implementations other arrangements of the interconnects may be used. For example, the interconnects may be configured as straight lines, configured such that adjacent interconnects have the same electrical length, and so forth.

At 704, the signal line 408 of the first printed circuit 110 is connected to the first end of the substrate signal interconnect 410 with a first interconnect tab 116.

At 706, the signal line 408 of the second printed circuit 120 is connected to the second end of the substrate signal interconnect 410 with a second interconnect tab 116. Once both of the interconnect tabs 116 are connected, signals may traverse from one printed circuit to the other. As shown in this figure, the signals pass through the substrate signal interconnects 410 free from modification by a processor, op-amp, or other active signal processing device.

FIG. 8 is an illustrative process 800 of coupling two interconnect tabs to substrate interconnects and then coupling a printed circuit to each of the interconnect tabs. At 802, one or more substrate signal interconnects 410 are formed on or within the substrate. The substrate signal interconnects 410 or substrate data signal interconnects 118 may be formed from operations including bonding, lamination, deposition, etching, imprint lithography, and so forth. As above, the substrate signal interconnects 410 have first and second ends that are disposed at different locations on the substrate, such as adjacent to a first side and a second side, respectively.

At 804, a first side of a first interconnect tab 116 is connected to the first end of the substrate signal interconnect 410. A first side of a second interconnect tab 116 is also connected to the second end of the substrate signal interconnect 410. At this point, the substrate 102 may be visualized as having the substrate signal interconnects 410 and interconnect tabs 116 extending therefrom.

At 806, the first circuit board 110 is connected to a second side of the first interconnect tab 116. Likewise, the second circuit board 120 is connected to a second side of the second interconnect tab. As a result, the signal lines 408 of the second printed circuit are in communication with the signal lines of the first printed circuit 110.

Illustrative Device Utilizing Substrate Interconnect Routing

Figure 9:
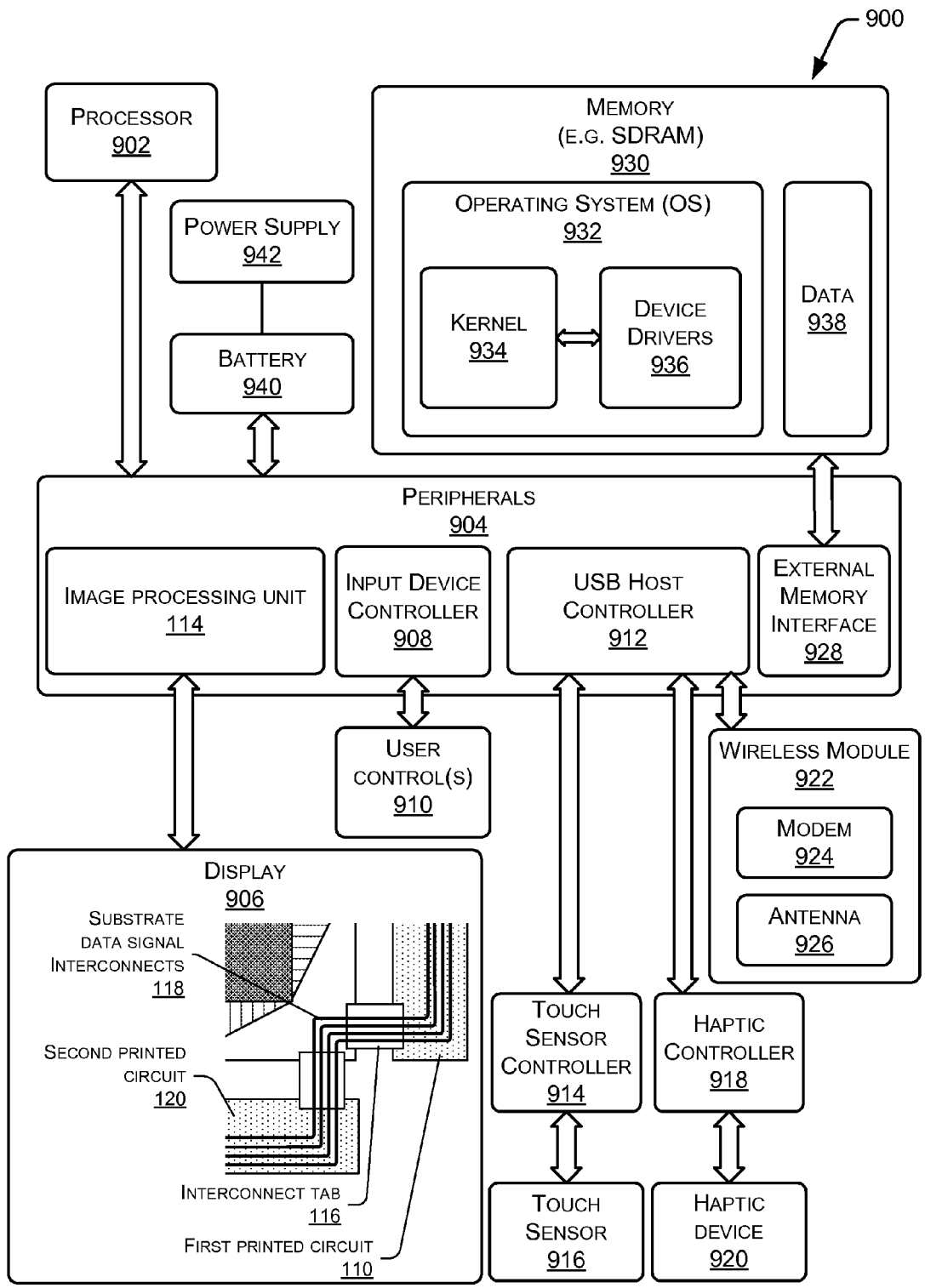
FIG. 9 is an illustrative schematic of an electronic device utilizing substrate interconnect routing.

FIG. 9 is an illustrative schematic 900 of an electronic device which may utilize substrate interconnect routing, such as an eBook reader device, cellular phone, tablet computer, netbook, and so forth. In a very basic configuration, the device includes components such as a processor 902 and one or more peripherals 904. Each processor 902 may itself comprise one or more processors.

The peripherals 904 couple to the processor 902. An image processing unit 114 is shown coupled to one or more display components 906 (or "displays"). In some implementations, multiple displays may be present and coupled to the image processing unit 114. These multiple displays may be located in different enclosures or panels. Furthermore, one or more image processing units 114 may couple to the multiple displays.

The display 906 may present content in a human-readable format to a user. The display 906 may be reflective, emissive, or a combination of both. Reflective displays utilize incident light to present an image and include electrophoretic displays, interferometric modulator displays, cholesteric displays, pre-printed sheets, and so forth. For example, an electrophoretic display may be configured to present changeable content, such as different pages from an eBook, while a pre-printed sheet may be configured to present pre-determined content such as icons, letters, text, and so forth.

Emissive displays do not rely on incident light and, instead, emit light to present an image. Emissive displays include backlit liquid crystal displays, time multiplexed optical shutter displays, light emitting diode displays, backlit pre-printed sheets, and so forth. When multiple displays are present, these displays may be of the same or different types. For example, one display may be an electrophoretic display while another may be a liquid crystal display. The display 906 is generally flexible such that it transmits a force (such as a touch) applied to its surface to the touch sensor, or the display transmits a haptic output from the haptic actuator to the user.

The content presented on the display 906 may take the form of electronic books or "eBooks." For example, the display 906 may depict the text of the eBooks and also any illustrations, tables, or graphic elements that might be contained in the eBooks. The terms "book" and/or "eBook", as used herein include electronic or digital representations of printed works, as well as content objects that may include text, multimedia, hypertext, hypermedia, and so forth. Examples of printed and/or digital works include, but are not limited to, books, magazines, newspapers, periodicals, journals, reference materials, telephone books, textbooks, anthologies, instruction manuals, proceedings of meetings, forms, directories, maps, web pages, and so forth. Accordingly, the terms "book" and/or "eBook" may include any readable or viewable content that is in an electronic or digital form.

The display 906 may comprise the substrate 102 and other printed circuits such as the first printed circuit 110, second printed circuit 120, and so forth. The printed circuits are interconnected via the substrate data signal interconnects 118 on the substrate 102 using the interconnect tabs 116 as described above.

The device may have an input device controller 908 configured to accept input from the touch sensor, keypad, keyboard, or other user actuable controls 910. These user actuable controls 910 may have dedicated or assigned operations. For instance, the actuable controls 910 may include fixed controls such as page turning buttons, navigational keys, a power on/off button, selection keys, a joystick, a dedicated button on a touch sensor, and so forth. These controls are "fixed" in the sense that they have a pre-determined physical position and manifestation. Actions associated with these controls may vary according to configuration, operating mode, and so forth.

A USB host controller 912 may also be present. The USB host controller 912 manages communications between devices attached to a universal serial bus ("USB") the processor 902, as well as other peripherals. These peripherals may include a touch sensor controller 914 coupled to the processor 902 via the USB host controller 912 (as shown). In other implementations the touch sensor controller 914 may couple to the processor via the input device control 908, inter-integrated circuit ("I$^2$C"), universal asynchronous receiver/transmitter ("UART"), serial peripheral interface bus ("SPI"), or other interface. The touch sensor controller 914 is also coupled to the touch sensor 916. The touch sensor controller 914 may be configured to determine characteristics of interaction with the touch sensor 916. These characteristics may include the location of a touch on the touch sensor 916, magnitude of the touch, shape of the touch, and so forth. In one implementation, the touch sensor 916 may comprise an interpolating touch sensitive resistor (IFSR) array.

A haptic controller 918 may couple a haptic device 920 to the USB host controller 912. In another implementation, the haptic controller 918 may couple to another interface within the electronic device. The haptic controller 918 provides drive signals that activate the haptic actuators within the haptic device 920. The haptic actuators are configured to generate a haptic output which may be felt by the user. The haptic output, for example, may simulate the tactile experience of the user pushing a button presented on the display 106 as if the button were an actual mechanical button.

The display 906, touch sensor 916, and other components within the device may be implemented in any shape and may have any ratio of height to width. These components may be curved or otherwise non-linearly shaped. Furthermore, the display 906, touch sensor 916, and other components may be flexible and configured to fold or roll.

A wireless module 922 may couple to the USB host controller 912 via the universal serial bus. The wireless module 922 may allow for connection to wireless local area networks ("WLANs") or wireless wide area networks ("WWANs"). The wireless module 922 may include a modem 924 configured to send and receive data wirelessly and one or more antennas 926 suitable for propagating a wireless signal. In other implementations, a wired network interface may be provided.

The electronic device may also include an external memory interface ("EMI") 928 coupled to external memory 930. The EMI 928 manages access to data stored in external memory 930. The external memory 930 may comprise Static Random Access Memory ("SRAM"), Pseudostatic Random Access Memory ("PSRAM"), Synchronous Dynamic Random Access Memory ("SDRAM"), Double Data Rate SDRAM ("DDR"), Phase-Change RAM ("PCRAM"), or other computer-readable storage media.

The external memory 930 may store an operating system 932 comprising a kernel 934 operatively coupled to one or more device drivers 936. The device drivers 936 are also operatively coupled to the peripherals 904. The external memory 930 may also store data 938, which may comprise content objects for consumption on device, executable programs, databases, user settings, configuration files, device status, and so forth.

One or more batteries 940 may be present to provide operational electrical power to components of the device for operation when the device is disconnected from a power supply 942. Operational electrical power is sufficient to provide for operation of the device and is distinguished from the lesser electrical power requirements of a sleep or state retention mode.

The power supply 942 may be internal or external to the device. The power supply 942 is configured to provide operational power for the device, charge the battery 940, or both. "Battery" as used in this application includes components capable of acting as a power source to an electronic device. Power sources include chemical storage cells such as lithium polymer batteries, charge storage devices such as ultracapacitors, fuel cells, and so forth.

Furthermore, the device may include one or more other, non-illustrated peripherals, such as a hard drive using magnetic, optical, or solid state storage to store information, a firewire bus, a Bluetooth™ wireless network interface, a camera, an accelerometer, an ambient light sensor, a global positioning system, a PC Card component, and so forth.

Coupling between components are shown for emphasis, and not by way of limitation. There are couplings between many of the components illustrated in FIG. 9, but graphical arrows are omitted for clarity of illustration.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims. For example, the methodological acts need not be performed in the order or combinations described herein, and may be performed in any combination of one or more acts.

What is claimed is:

1. A device comprising:
a display having a substrate;
a plurality of display subprocessors coupled to the display via a fan-out of drive signal lines;
a first printed circuit configured to couple one or more of the display subprocessors to an image processing unit;
one or more substrate data signal interconnects disposed on the substrate, each substrate data signal interconnect having a first end proximate to a first side of the substrate proximate to the first printed circuit and a second end proximate to a second side of the substrate and proximate to a second printed circuit;

a first interconnect tab configured to couple the first printed circuit to the first end of the one or more substrate data signal interconnects; and the second printed circuit configured to couple the one or more of the display subprocessors of the first printed circuit to the image processing unit via a second interconnect tab coupling the second end of the one or more substrate data signal interconnects to the second printed circuit.

2. The device of claim 1, wherein the display comprises an electrophoretic display.

3. The device of claim 1, wherein the first and second printed circuits comprise a flexible printed circuit.

4. The device of claim 1, wherein the interconnect tab comprises a flexible printed circuit.

5. The device of claim 1, wherein the interconnect tab comprises an extension of the printed circuit.

6. The device of claim 1, the subprocessors further comprising a multiplexor.

7. The device of claim 1, embodied within an electronic book reader.

8. A device comprising:

a display comprising a thin-film transistor matrix (TFTM) disposed on a substrate;

a first display subprocessor coupled to at least a portion of the TFTM via a first fan-out of drive signal lines disposed on a first flexible printed circuit;

a second display subprocessor coupled to at least a portion of the TFTM via a second fan-out of drive signal lines disposed on a second flexible printed circuit; and one or more data signal lines coupling the first display subprocessor to a display controller via the second flexible printed circuit and one or more substrate data signal interconnects disposed on the substrate.

9. The device of claim 8, wherein the display comprises an electrophoretic display.

10. The device of claim 8, wherein the subprocessors are disposed on the flexible printed circuits.

11. The device of claim 8, embodied within an electronic book reader.

12. A device comprising:

an addressable array having a substrate;

a first printed circuit configured to couple at least a portion of the addressable array to a controller;

one or more substrate interconnects disposed on the substrate, each substrate interconnect having a first end proximate to a first side of the substrate and a second end proximate to a second side of the substrate;

a first interconnect tab coupling the first printed circuit to the first end of the one or more substrate interconnects; and a second interconnect tab coupling a second printed circuit to the second end of the one or more substrate interconnects, wherein the second printed circuit is configured to couple at least a portion of the addressable array to the controller via the first and second interconnect tabs and the one or more substrate interconnects.

13. The device of claim 12, further comprising a subprocessor or multiplexor coupled between the addressable array and the controller.

14. The device of claim 12, wherein the addressable array comprises at least a portion of a display.

15. The device of claim 12, wherein the addressable array comprises at least a portion of a touch sensor.

16. The device of claim 12, wherein the interconnect tab comprises a flexible printed circuit.

17. The device of claim 12, wherein the first and second printed circuits comprise flexible printed circuits.

18. The device of claim 12, wherein the substrate interconnects are configured to transport an electromagnetic signal.

19. A method comprising:

forming a substrate signal interconnect on an array substrate having a first end proximate to a first side of the substrate and a second end proximate to a second side of the substrate;

connecting a data signal line of a first printed circuit to the first end of the substrate signal interconnect with a first interconnect tab; and connecting a data signal line of a second printed circuit to the second end of the substrate signal interconnect with a second interconnect tab.

20. The method of claim 19, wherein the forming of the substrate signal interconnect comprises one or more of etching, depositing, or laminating a conductive pathway.

21. The method of claim 19, wherein the connecting comprises adhesion, lamination, soldering, or welding.

22. The method of claim 19, wherein the array substrate comprises a thin-film transistor matrix.

23. The method of claim 19, wherein the array substrate comprises at least a portion of an interpolating force sensing resistor array.

24. A method comprising:

forming a substrate signal interconnect on an array substrate having a first end proximate to a first side of the substrate and a second end proximate to a second side of the substrate;

connecting a first side of a first interconnect tab to the first end of the substrate signal interconnect;

connecting a first side of a second interconnect tab to the second end of the substrate signal interconnect;

connecting a first circuit board to a second side of the first interconnect tab; and connecting a second circuit board to a second side of the second interconnect tab.

25. The method of claim 24, wherein the forming of the substrate data signal interconnect comprises one or more of etching, depositing, or laminating a conductive pathway.

26. The method of claim 24, wherein the connecting comprises adhesion, lamination, soldering, or welding.

27. The method of claim 24, wherein the array substrate comprises a thin-film transistor matrix.

28. The method of claim 24, wherein the array substrate comprises at least a portion of an interpolating force sensing resistor array.

* * * * *